(12) United States Patent
Kawasaki (10) Patent No.: US 11,057,015 B2
(45) Date of Patent: Jul. 6, 2021

(54) SURFACE ACOUSTIC WAVE DEVICE

(71) Applicant: Murata Manufacturing Co., Ltd., Nagaokakyo (JP)

(72) Inventor: Koichiro Kawasaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/529,877

(22) Filed: Aug. 2, 2019

(65) Prior Publication Data

US 2019/0356298 A1 Nov. 21, 2019

Related U.S. Application Data

(63) Continuation of application No. PCT/JP2018/002252, filed on Jan. 25, 2018.

(30) Foreign Application Priority Data

Feb. 3, 2017 (JP) .............................. JP2017-018684

(51) Int. Cl.
*H03H 9/05* (2006.01)
*H03H 9/10* (2006.01)
(Continued)

(52) U.S. Cl.
CPC ........ *H03H 9/059* (2013.01); *H03H 9/02543* (2013.01); *H03H 9/02559* (2013.01);
(Continued)

(58) Field of Classification Search
CPC ............... H03H 9/059; H03H 9/02543; H03H 9/02559; H03H 9/1092; H03H 9/145;
(Continued)

(56) References Cited

U.S. PATENT DOCUMENTS

2013/0314173 A1 11/2013 Inoue
2016/0277006 A1 9/2016 Kaneda et al.
(Continued)

FOREIGN PATENT DOCUMENTS

JP 11-163668 A 6/1999
JP 2013-247466 A 12/2013
(Continued)

OTHER PUBLICATIONS

Machine English Translation of JP2017022501A Published on Jan. 26, 2017 (Year: 2017).*
(Continued)

*Primary Examiner* — Robert J Pascal
*Assistant Examiner* — Jorge L Salazar, Jr.
(74) *Attorney, Agent, or Firm* — Keating & Bennett, LLP (57) ABSTRACT

A surface acoustic wave device includes a piezoelectric substrate and functional elements on a first surface of the piezoelectric substrate. At least a portion of the functional elements includes an interdigital transducer (IDT) electrode, and a surface acoustic wave resonator is defined by the piezoelectric substrate and the IDT electrode. A portion of a wiring pattern connecting a first functional element and a second functional element is on a second surface different from the first surface of the piezoelectric substrate.

20 Claims, 8 Drawing Sheets

(51) Int. Cl.
*H03H 9/64* (2006.01)
*H03H 9/02* (2006.01)
*H03H 9/145* (2006.01)
*H03H 9/25* (2006.01)
*H03H 9/68* (2006.01)
*H03H 9/72* (2006.01)

(52) U.S. Cl.
CPC .......... *H03H 9/1092* (2013.01); *H03H 9/145* (2013.01); *H03H 9/25* (2013.01); *H03H 9/6483* (2013.01); *H03H 9/68* (2013.01); *H03H 9/725* (2013.01)

(58) Field of Classification Search
CPC .......... H03H 9/25; H03H 9/6483; H03H 9/68; H03H 9/725; H03H 9/6436; H03H 9/542; H03H 9/6489; H03H 9/1071
USPC .......................................... 333/133, 193–196
See application file for complete search history.

(56) References Cited

U.S. PATENT DOCUMENTS

| | | |
|---|---|---|
| 2017/0194933 A1 | 7/2017 | Kishimoto et al. |
| 2018/0013404 A1 | 1/2018 | Kawasaki et al. |

FOREIGN PATENT DOCUMENTS

| | | |
|---|---|---|
| JP | 2014-171210 A | 9/2014 |
| JP | 5733791 B2 | 6/2015 |
| JP | 2016-178621 A | 10/2016 |
| JP | 2017-022501 A | 1/2017 |
| WO | 2016/068003 A1 | 5/2016 |
| WO | 2016208287 A1 | 12/2016 |

OTHER PUBLICATIONS

Official Communication issued in International Patent Application No. PCT/JP2018/002252, dated Apr. 3, 2018.

* cited by examiner

SURFACE ACOUSTIC WAVE DEVICE

CROSS REFERENCE TO RELATED APPLICATIONS

This application claims the benefit of priority to Japanese Patent Application No. 2017-018684 filed on Feb. 3, 2017 and is a Continuation Application of PCT Application No. PCT/JP2018/002252 filed on Jan. 25, 2018. The entire contents of each application are hereby incorporated herein by reference.

BACKGROUND OF THE INVENTION

1. Field of the Invention

The present invention relates to a surface acoustic wave device and, more particularly, to a technique for reducing a size of a surface acoustic wave device.

2. Description of the Related Art

A surface acoustic wave filter including a surface acoustic wave (SAW) resonator is typically used in an electronic device, such as a cellular phone, a smartphone, or the like.

In recent years, along with the miniaturization and high performance of these electronic devices, there has been a demand for reducing the size of the electronic components to be used and increasing the density of the electronic components, so that the surface acoustic wave resonator is also required to be miniaturized. In general, since the surface acoustic wave resonator has a structure in which a large number of comb-shaped electrodes (IDT: interdigital transducer) are arranged on a piezoelectric substrate, it is important to reduce a surface area of the piezoelectric substrate to enable the miniaturization of the surface acoustic wave resonator.

Japanese Patent No. 5733791 discloses a surface acoustic wave device having a structure in which a functional element, such as an IDT electrode, is arranged on a main surface of a piezoelectric substrate, a wiring electrode for connecting to an external device or the like is arranged on a surface opposite to the main surface of the piezoelectric substrate, and the functional element and the wiring electrode are connected by a through-electrode.

However, in the surface acoustic wave device disclosed in Japanese Patent No. 5733791, since a wiring pattern for connecting between the functional elements is formed on the surface of the piezoelectric substrate, there is a limit to reducing a surface area of the substrate. Moreover, since it is necessary to arrange the functional elements and the wiring pattern connecting between the functional elements on one surface of the substrate, the degree of freedom in designing an arrangement of each functional element and a route of the wiring pattern is also limited.

SUMMARY OF THE INVENTION

Preferred embodiments of the present invention reduce the size of surface acoustic wave devices and improve the degree of freedom in designing the surface acoustic wave device.

A surface acoustic wave device according to a preferred embodiment of the present invention includes a piezoelectric substrate and a plurality of functional elements on a first surface of the piezoelectric substrate. At least a portion of the plurality of functional elements includes an interdigital transducer (IDT) electrode, and a surface acoustic wave resonator is defined by the piezoelectric substrate and the IDT electrode. A portion of a wiring pattern connecting a first functional element and a second functional element included in the plurality of functional elements is provided on a second surface different from a first surface of the piezoelectric substrate.

Preferably, the second surface of the piezoelectric substrate is a back surface when the first surface is set as a front surface of the piezoelectric substrate.

Preferably, the piezoelectric substrate is a multilayer substrate in which two or more substrate layers are laminated. The piezoelectric substrate includes a first substrate layer and a second substrate layer laminated on the first substrate layer. The second surface of the piezoelectric substrate is a surface between the first substrate layer and the second substrate layer.

Preferably, the surface acoustic wave device further includes a first through-electrode and a second through-electrode penetrating from the first surface to the second surface of the piezoelectric substrate. A wiring pattern on the second surface of the piezoelectric substrate is connected to the first functional element by the first through-electrode and is connected to the second functional element by the second through-electrode.

Preferably, the wiring pattern on the second surface of the piezoelectric substrate is connected to the first functional element via the first wiring on a first side surface of the piezoelectric substrate, and is connected to the second functional element via the second wiring on a second side surface of the piezoelectric substrate.

Preferably, when the piezoelectric substrate is viewed from a lamination direction in a plan view, at least a portion of a wiring pattern on the first surface of the piezoelectric substrate overlaps with the wiring pattern on the second surface.

Preferably, when the piezoelectric substrate is viewed from the lamination direction in a plan view, a portion of the plurality of functional elements intersects with the wiring pattern on the second surface of the piezoelectric substrate.

Preferably, the surface acoustic wave device further includes an input terminal and an output terminal. The plurality of functional elements include a filter and a cancel circuit. The filter passes a signal in a predetermined frequency band among the input signals from the input terminal to the output terminal. The cancel circuit is connected in parallel to the filter between the input terminal and the output terminal. The cancel circuit attenuates a signal outside the range of the predetermined frequency band among the signals output from the output terminal. At least a portion of a wiring pattern extending to the output terminal from the input terminal through the cancel circuit is on the second surface of the piezoelectric substrate.

Preferably, the first functional element is the filter, and the second functional element is the cancel circuit. At least a portion of a wiring pattern connecting the filter and the cancel circuit is provided on the second surface of the piezoelectric substrate.

Preferably, when the filter is a reception filter, the input terminal is connected to an antenna, the output terminal is connected to the reception circuit, and the cancel circuit is connected in parallel to the reception filter.

Preferably, when the filter is a transmission filter, the input terminal is connected to the transmission circuit, the output terminal is connected to the antenna, and the cancel circuit is connected in parallel to the transmission filter.

Preferably, the cancel circuit includes an amplitude adjustment circuit that adjusts an amplitude of the input signal, and a phase adjustment circuit that adjusts a phase of the input signal. The first functional element is the amplitude adjustment circuit, and the second functional element is the phase adjustment circuit. At least a portion of the wiring pattern connecting the amplitude adjustment circuit and the phase adjustment circuit is provided on the second surface of the piezoelectric substrate.

Preferably, the cancel circuit includes first and second amplitude adjustment circuits and the phase adjustment circuit. The first amplitude adjustment circuit adjusts the amplitude of the input signal. The phase adjustment circuit adjusts the phase of the signal from the first amplitude adjustment circuit. The second amplitude adjustment circuit adjusts the amplitude of the signal from the phase adjustment circuit. The first functional element is the phase adjustment circuit, and the second functional element is at least one of the first amplitude adjustment circuit and the second amplitude adjustment circuit. At least one of a wiring pattern connecting the first amplitude adjustment circuit and the phase adjustment circuit, and a wiring pattern connecting the phase adjustment circuit and the second amplitude adjustment circuit is provided on the second surface of the piezoelectric substrate.

Preferably, the plurality of functional elements includes the transmission filter, the reception filter, and the cancel circuit. The transmission filter filters the signal from the transmission circuit received at the first terminal, and outputs the filtered signal to the antenna. The reception filter filters the signal received from the antenna and outputs the filtered signal to the reception circuit from the second terminal. The cancel circuit is connected between the first terminal and the second terminal, and reduces the influence of the signal received at the first terminal on the signal output from the second terminal. A portion of a wiring pattern connected to the second terminal from the first terminal through the cancel circuit is provided on the second surface of the piezoelectric substrate.

Preferably, the piezoelectric substrate is made of a single crystal material of any one of lithium tantalate ($LiTaO_3$), lithium niobate ($LiNbO_3$), alumina, silicon (Si), and sapphire, or a laminated material made of $LiTaO_3$ or $LiNbO_3$.

According to preferred embodiments of a surface acoustic wave device of the present invention, a plurality of functional elements are on one surface of the piezoelectric substrate, and at least a portion of a wiring pattern connecting between the functional elements is provided on a second surface which is different from a first surface. Thus, an area that defines the wiring pattern connecting between the functional elements on the first surface is able to be reduced, so that the surface acoustic wave device is able to be made smaller. Since a portion of the wiring pattern is provided on the second surface, the functional element and wiring pattern on the first surface and the wiring pattern on the second surface are able to be arranged three dimensionally rather than two dimensionally, so that the degree of freedom in designing the device is improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described in detail with reference to the drawings. Note that the same or corresponding portions in the diagrams are denoted by the same reference signs, and the description thereof will not be repeated.

First Preferred Embodiment

Figure 1:
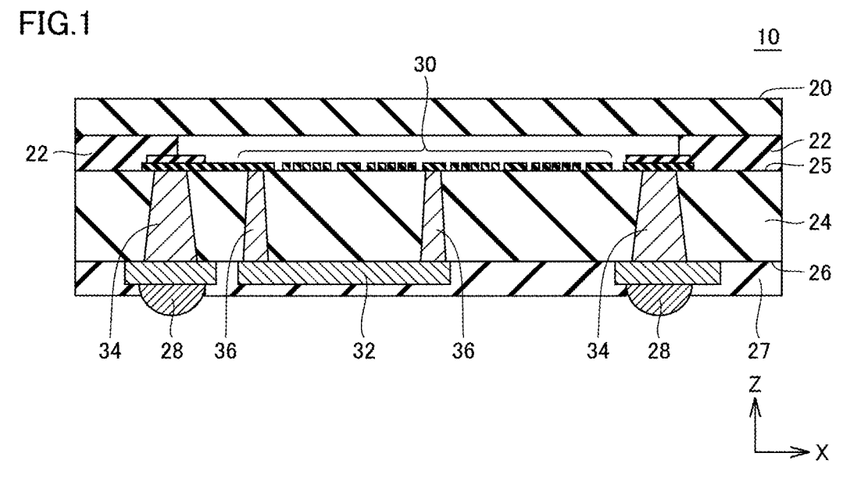
FIG. 1 is a cross-sectional view of a surface acoustic wave device according to a first preferred embodiment of the present invention.

FIG. 1 illustrates a cross-sectional view of an example of a surface acoustic wave device 10 according to a first preferred embodiment of the present invention. Referring to FIG. 1, the surface acoustic wave device 10 preferably includes a cover portion 20, a support portion 22, a piezoelectric substrate 24, and a support substrate 27.

The piezoelectric substrate 24 is laminated on the supporting substrate 27. The piezoelectric substrate 24 is preferably made of, for example, a piezoelectric single crystal material such as lithium tantalate (LiTaO$_3$), lithium niobate (LiNbO$_3$), alumina (Al$_2$O$_3$), and sapphire, or a piezoelectric laminated material made of LiTaO$_3$, LiNbO$_3$, or silicon (Si). A plurality of functional elements 30 are provided on a first surface 25 of the piezoelectric substrate 24. An example of the functional elements 30 includes, for example, a pair of comb-shaped electrodes (i.e., an IDT: interdigital transducer) made using an electrode material, such as a single metal composed of at least one of aluminum, copper, silver, gold, titanium, tungsten, platinum, chromium, nickel and molybdenum, or an alloy containing these as a main component. A surface acoustic wave resonator is defined by the piezoelectric substrate 24 and the IDT electrode.

The support portion 22 is provided on the first surface of the piezoelectric substrate 24. By arranging the cover portion 20 to oppose the first surface 25 with the support portion 22 interposed therebetween, a space is defined around the plurality of functional elements 30 including the IDT electrodes. In this way, a surface acoustic wave propagates in a portion adjacent to the space of the piezoelectric substrate 24.

A through-electrode 34 is preferably provided in the piezoelectric substrate 24 in a lamination direction (Z-axis direction in FIG. 1), and the functional elements 30 are connected to a terminal electrode 28 on the support substrate 27 by the through-electrode 34. The terminal electrode 28 is preferably, for example, a terminal to be electrically connected to a mounting substrate (not illustrated). The functional elements 30 are connected to an external circuit or a ground potential via the terminal electrode 28.

A portion of a wiring pattern (e.g., a wiring pattern 32 in FIG. 1) connecting the functional elements 30 is provided on a second surface 26 of the piezoelectric substrate 24. The wiring pattern 32 is connected to the functional elements 30 on the first surface by a through-electrode 36. Note that although not clearly illustrated, among the wiring patterns connecting the functional elements 30 to each other, those other than the wiring pattern 32 on the second surface 26 are provided on the first surface 25. Additionally, in FIG. 1, only one wiring pattern 32 is illustrated on the second surface 26, but a plurality of wiring patterns may preferably be provided on the second surface 26.

Figure 2:
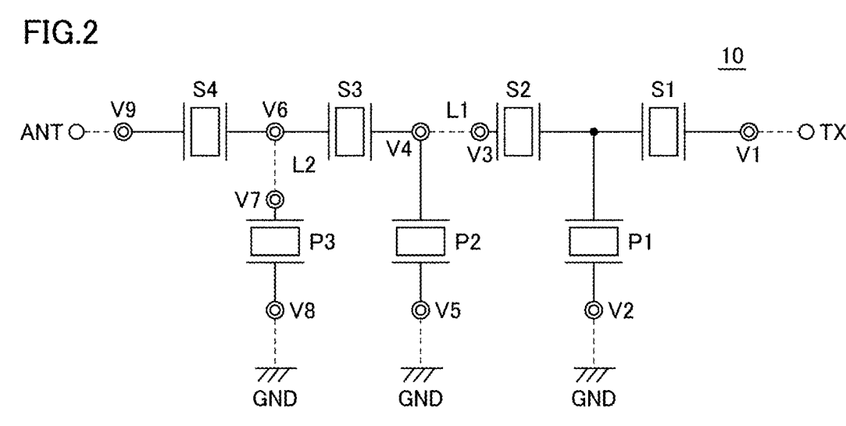
FIG. 2 is a diagram illustrating an example of an equivalent circuit of the surface acoustic wave device according to the first preferred embodiment of the present invention.

FIG. 2 is a diagram illustrating an example of an equivalent circuit of the surface acoustic wave device 10 in FIG. 1. In the equivalent circuit of FIG. 2, a case where the surface acoustic wave device 10 is a transmission filter used in a communication device, such as a smartphone, will be described as an example.

The surface acoustic wave device 10 is preferably connected to a transmission circuit (not illustrated) by an input terminal (terminal TX), and is connected to an antenna (not illustrated) by an output terminal (terminal ANT). The surface acoustic wave device 10 is preferably a ladder filter including series arm resonance portions S1 to S4 connected in series to a series arm provided between the input terminal TX and the output terminal ANT, and parallel arm resonance portions P1 to P3 provided on a parallel arm connected between the series arm and a ground potential GND. Each resonance portion is preferably defined by one or more surface acoustic wave resonators, and corresponds to the functional elements 30 in FIG. 1. Note that the configuration of the transmission filter illustrated in FIG. 2 is an example, and other configurations may also be used as long as it is a filter defined by the surface acoustic wave resonator.

One end of the parallel arm resonance portion P1 is connected to a connection node between the series arm resonance portion S1 and the series arm resonance portion S2, and the other end thereof is connected to the ground potential GND. One end of the parallel arm resonance portion P2 is connected to a connection node between the series arm resonance portion S2 and the series arm resonance portion S3, and the other end thereof is connected to the ground potential GND. One end of the parallel arm resonance portion P3 is connected to a connection node between the series arm resonance portion S3 and the series arm resonance portion S4, and the other end thereof is connected to the ground potential GND.

Here, double circles indicated by V1, V2, V5, V8, V9 in FIG. 2 represent the through-electrodes 34 in FIG. 1, and double circles indicated by V3, V4, V6, V7 in FIG. 2 represent the through-electrodes 36 in FIG. 1. Further, among the wiring patterns to be connected between the input/output terminals and the respective resonance portions, wiring patterns indicated by a solid line are provided on the first surface 25 of the piezoelectric substrate 24 in FIG. 1, and wiring patterns indicated by a broken line are provided on the second surface 26.

Figure 3A:
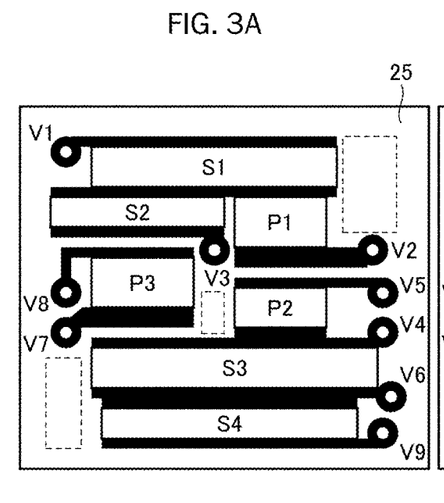
FIGS. 3A and 3B are diagrams illustrating an example of an arrangement of functional elements and wiring patterns on a piezoelectric substrate of the surface acoustic wave device of FIG. 2.
Figure 3B:
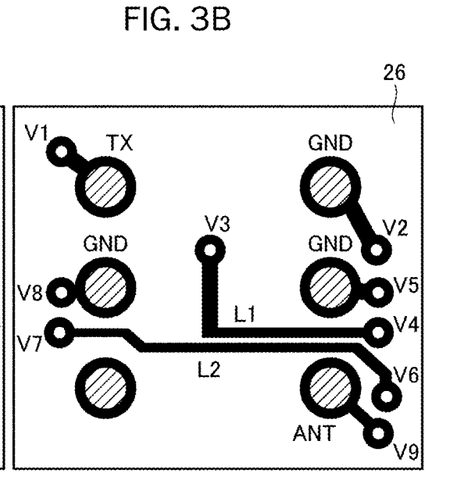

FIGS. 3A and 3B are diagrams illustrating an example of an arrangement of each resonance portion and wiring pattern on the piezoelectric substrate of FIG. 2. FIGS. 3A and 3B are diagrams of the first surface 25 and the second surface 26 of the piezoelectric substrate 24 in FIG. 1, respectively, when viewed from a positive direction to a negative direction of the Z-axis in the figure in a plan view.

Referring to FIGS. 3A and 3B, in the first surface 25, the series arm resonance portion S1 is connected to the series arm resonance portion S2 and the parallel arm resonance portion P1 by the wiring pattern. The series arm resonance portion S1 is connected to the terminal TX of the second surface 26 via the through-electrode V1. The parallel arm resonance portion P1 is connected to the terminal GND of the second surface 26 via the through-electrode V2. The series arm resonance portion S2 is connected to one end of a wiring pattern L1 of the second surface 26 via the through-electrode V3. The other end of the wiring pattern L1 is connected to a wiring pattern connected to the series arm resonance portion S3 and the parallel arm resonance portion P2 on the first surface 25 via the through-electrode V4.

The series arm resonance portion S3 is connected to the series arm resonance portion S4 by another wiring pattern and connected to one end of a wiring pattern L2 of the second surface 26 via the through-electrode V6. The other end of the wiring pattern L2 is connected to the parallel arm resonance portion P3 of the first surface 25 via the through-electrode V7. The parallel arm resonance portion P3 is further connected to the terminal GND of the second surface 26 via the through-electrode V8. The series arm resonance portion S4 is further connected to the terminal ANT of the second surface 26 via the through-electrode V9.

Note that in the examples illustrated in FIG. 2 and FIGS. 3A and 3B, only the wiring patterns L1 and L2 are provided on the second surface, but in a case where the connection of the resonance portions is different, another wiring pattern may be provided on the second surface if necessary.

Figure 4A:
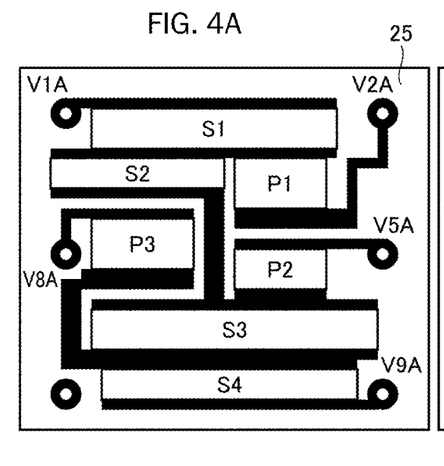
FIGS. 4A and 4B are layout diagrams of a comparative example in which functional elements and wiring patterns are arranged only on a front surface of the piezoelectric substrate of the surface acoustic wave device.
Figure 4B:
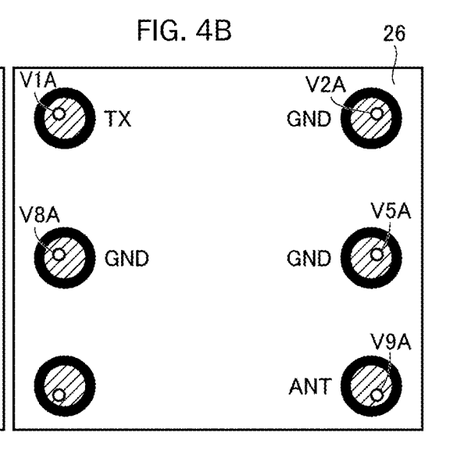

FIGS. 4A and 4B are diagrams corresponding to FIGS. 3A and 3B in a case of a comparative example in which all functional elements and wiring patterns are provided on the first surface of the piezoelectric substrate. When the figures of the first surface illustrated in FIG. 3A and FIG. 4A are compared with each other, the spaces surrounded by the broken line in FIG. 3A are empty. In this manner, in the surface acoustic wave device 10 according to the first preferred embodiment, a portion of the wiring pattern connecting between the resonance portions is provided on the second surface 26 which is the back surface side, such that the surface area occupied by the functional element and the wiring pattern on the first surface 25 side is reduced.

In FIG. 3A, in order to facilitate comparison with FIG. 4A, each resonance portion is arranged at the same position, but for example, by arranging each resonance portion so that the empty spaces are moved to a left end portion of the piezoelectric substrate 24, the size of the piezoelectric substrate 24 is able to be reduced. This makes it possible to reduce the size of the surface acoustic wave device, which leads to a reduction in component cost.

In addition, when the functional element and the wiring pattern are only on the first surface in a plane as illustrated in FIG. 4A, it is necessary to design the arrangement in a manner such that the wiring patterns do not intersect with each other and the wiring pattern does not intersect with the functional element. However, as in the surface acoustic wave device according to the first preferred embodiment, by arranging a portion of the wiring patterns on the second surface, it is also possible to provide an arrangement in a manner such that the wiring pattern on the second surface intersects with the wiring pattern on the first surface when the piezoelectric substrate is viewed in a plan view. Further, by arranging a portion of the wiring pattern on the second surface, the wiring pattern on the second surface is able to be arranged to overlap with the functional element on the first surface when the piezoelectric substrate is viewed in a plan view. That is, by arranging the functional element and the wiring pattern three dimensionally, the degree of freedom in design is improved.

In the first preferred embodiment described above, a case where the piezoelectric substrate 24 is a single layer substrate has been described as the example. In this case, when the first surface 25 on which the functional element is arranged is the front surface, the second surface 26 is the back surface of the piezoelectric substrate 24. In the first variation, a case where the piezoelectric substrate is a multilayer substrate will be described.

Figure 5:
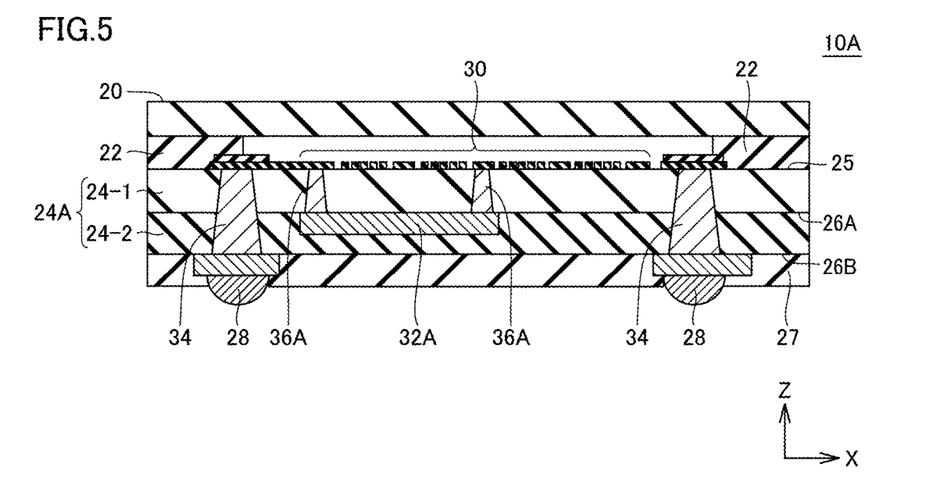
FIG. 5 is a cross-sectional view of a first variation on the first preferred embodiment of the present invention.

FIG. 5 is a cross-sectional view of a surface acoustic wave device 10A according to the first variation. In FIG. 5, it is different in that, mainly, a piezoelectric substrate 24A is preferably a multilayer substrate in which a first substrate 24-1 and a second substrate 24-2 are laminated, as compared with FIG. 1. Note that in FIG. 5, the description of the elements that are similar to those in FIG. 1 will not be repeated.

When the piezoelectric substrate 24A includes a plurality of substrates, not only a back surface 26B of the piezoelectric substrate 24A but also an intermediate surface 26A between the first substrate 24-1 and the second substrate 24-2 may be used as the second surface different from the first surface 25 (e.g., a front surface of the piezoelectric substrate 24A) on which the functional elements 30 are arranged. In FIG. 5, an example is illustrated in which the intermediate surface 26A is used as the second surface, and a wiring pattern 32A is provided on the intermediate surface 26A. In this case, the wiring pattern 32A is connected to the functional element on the first surface 25 by a through-electrode 36A in the first substrate 24-1.

Note that, a wiring pattern may be provided on both of the intermediate surface 26A and the back surface 26B. Further, in a case where the piezoelectric substrate is the multilayer substrate in which three or more substrates are laminated, the wiring pattern may be provided on a plurality of intermediate surfaces.

In the case where the multilayer substrate is used as the piezoelectric substrate as described above, since the back surface and the intermediate surface is able to be used as the second surface different from the first surface on which the functional element is arranged, the degree of freedom in designing the functional element and the wiring pattern is further improved, and further miniaturization of the surface acoustic wave device is able to be achieved by designing the wiring pattern in an appropriate arrangement.

In the first preferred embodiment and the first variation, the examples in which the functional element on the first surface of the piezoelectric substrate and the wiring pattern on the second surface are connected by the through-electrode have been described. In a second variation of the first preferred embodiment, an example will be described in which the functional element on the first surface and the wiring pattern on the second surface are connected using a wiring pattern on a side surface of the piezoelectric substrate.

Figure 6:
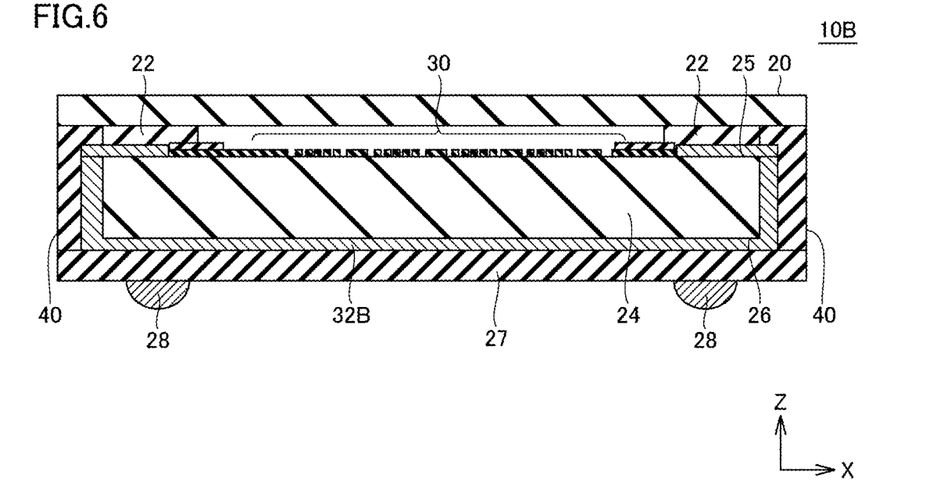
FIG. 6 is a cross-sectional view of a second variation on the first preferred embodiment of the present invention.

FIG. 6 is a cross-sectional view of a surface acoustic wave device 10B according to the second variation. In FIG. 6, the piezoelectric substrate 24 is housed in a box-shaped protective resin defined by the supporting substrate 27 and a side wall portion 40. A wiring pattern 32B on the second surface 26 of the piezoelectric substrate 24 further extends along the side surface of the piezoelectric substrate 24 to the first surface 25 of the piezoelectric substrate 24, and is connected to the functional elements 30 on the first surface 25.

Figure 7A:
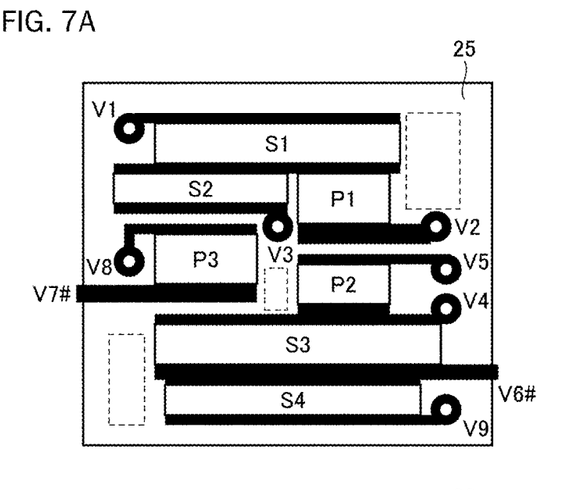
FIGS. 7A and 7B are diagrams illustrating an example of an arrangement of functional elements and wiring patterns on a piezoelectric substrate of a surface acoustic wave device of FIG. 6.
Figure 7B:
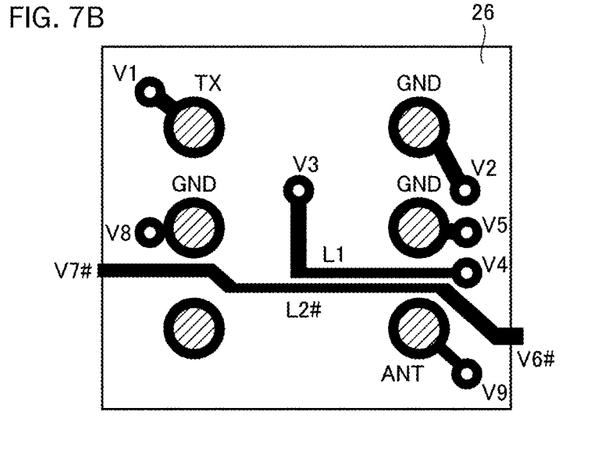

FIGS. 7A and 7B are diagrams illustrating an example of the arrangement of functional elements and wiring patterns on the piezoelectric substrate 24 of the surface acoustic wave device 10B in FIG. 6. In FIGS. 7A and 7B, one end of a wiring pattern L2 #on the second surface 26 preferably rises up to the first surface 25 by a wiring pattern V7 #on a left side surface of the piezoelectric substrate 24 in FIGS. 7A and 7B, and is connected to the parallel arm resonance portion P3. The other end of the wiring pattern L2 #preferably rises up to the first surface 25 by a wiring pattern V6 #on a right side surface of the piezoelectric substrate 24, and is connected to a wiring pattern connecting the series arm resonance portion S3 and the series arm resonance portion S4.

As in the second variation, by connecting the wiring pattern on the second surface to the functional element on the first surface using the wiring pattern on the side surface, the surface area occupied by the functional element and the wiring pattern on the piezoelectric substrate is reduced in the same or substantially the same manner as in the example of FIG. 1, and the degree of freedom in design is improved.

Note that in the example illustrated in FIGS. 7A and 7B, a case where both end portions of the wiring pattern L2 #extend to the first surface by the wiring patterns on the side surfaces is explained as an example, but a configuration in which either one end portion of the wiring pattern L2 #uses the wiring pattern on the side surface and the other end portion uses the through-electrode may be provided. Further, the configuration of the second variation may be applied to the first variation which uses the intermediate surface of the multilayer substrate.

In the first preferred embodiment, the case where the surface acoustic wave device is the transmission filter of the communication device has been described as an example, but the configuration of the present preferred embodiment is also applicable to a case of a reception filter of the communication device.

Figure 8:
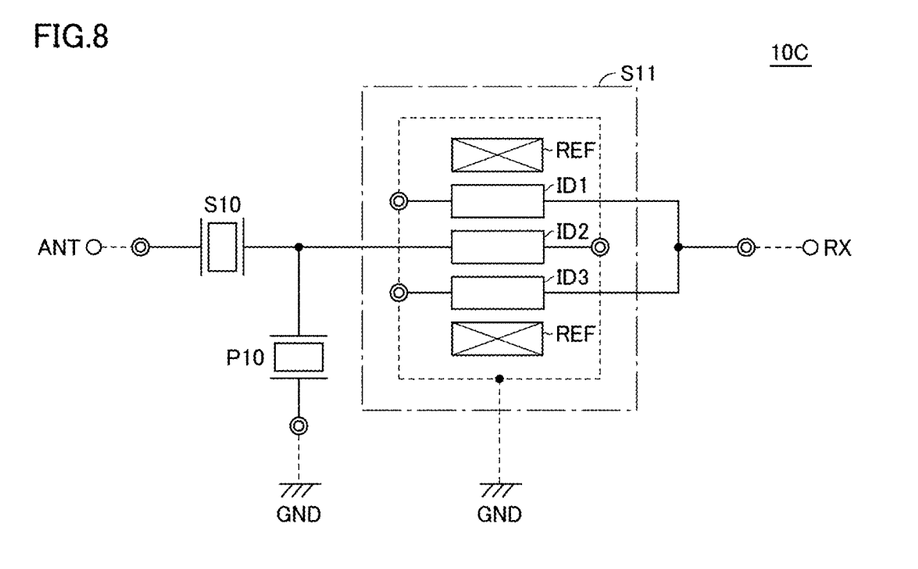
FIG. 8 is a diagram illustrating an equivalent circuit of a third variation of the first preferred embodiment of the present invention in a case of a longitudinally coupled resonator filter.

FIG. 8 is a diagram illustrating an example of an equivalent circuit in a case where the surface acoustic wave device is the reception filter.

Referring to FIG. 8, a surface acoustic wave device 10C is connected to the antenna (not illustrated) by an input terminal ANT, and is connected to a reception circuit (not illustrated) by an output terminal RX. The surface acoustic wave device 10C is a filter including series arm resonance portions S10 and S11 connected in series to a series arm provided between the input terminal ANT and the output terminal RX, and a parallel arm resonance portion P10 connected between the series arm and the ground potential GND.

The series arm resonance portion S11 defines a longitudinally coupled resonator filter. The series arm resonance portion S11 includes IDT electrodes ID1 to ID3 and a reflector REF.

One end of the IDT electrode ID2 is connected to the series arm resonance portion S10, and the other end thereof is connected to the ground potential GND via the through-electrode. The IDT electrode ID1 is arranged adjacent to a side surface on one side of the IDT electrode ID2. The IDT electrode ID3 is arranged adjacent to a side surface on the other side of the IDT electrode ID2. One end of each of the IDT electrodes ID1 and ID3 is connected to the output terminal RX. The other end of each of the IDT electrodes ID1 and ID3 is connected to the ground potential GND via the through-electrode. The reflector REF is arranged adjacent to each of the IDT electrodes ID1 and ID3.

As can be seen from FIG. 8, in such a longitudinally coupled resonator filter, when a wiring pattern (corresponding to a portion indicated by a broken line in FIG. 8) to the ground potential GND is provided on the first surface, a portion intersecting a wiring pattern connecting the IDT electrodes ID1 and ID3 and the output terminal RX may be generated. Therefore, in a case where the wiring patterns are only on the first surface, it is necessary to provide a three dimensional configuration in which an insulating layer is provided between the wiring patterns at the intersecting portions.

However, as illustrated in FIG. 8, since the wiring pattern that connects to the ground potential GND is provided on the second surface, the intersecting portion of the wiring patterns on the first surface is able to be eliminated, so that the manufacturing process is simplified and the manufacturing cost is reduced.

Note that the configurations of the first and second variations may also be applied to the third variation.

Second Preferred Embodiment

In the first preferred embodiment, a case where the surface acoustic wave device is the transmission filter or the reception filter has been described, but in general, such a filter functions as a band-pass filter that passes a signal in a specific frequency band. In the band-pass filter, it is preferable that an attenuation amount in the frequency band outside the above described pass band is large.

In such a case, a configuration is known in which an additional circuit is added in parallel to a filter as disclosed in, for example, Japanese Unexamined Patent Application Publication No. 2014-171210 to ensure the attenuation amount in the blocking band. The additional circuit, in general, generates a signal component having a phase opposite to that of the signal passing through the filter, and adds the signal component to the output signal, thus canceling the amplitude of the output signal in the blocking band to ensure the attenuation amount.

On the other hand, when such an additional circuit is provided on the surface acoustic wave device, additional surface area on the piezoelectric substrate is required, so that the device size may be increased.

Here, although the additional circuit is connected in parallel to the filter between the input terminal and the output terminal, as illustrated in FIGS. 3A and 3B and the like, the input terminal and the output terminal are generally provided at positions as far apart from each other as possible to prevent leakage of the signal due to capacitive coupling. Therefore, the wiring pattern connecting the additional circuit and the input terminal and the output terminal tends to be relatively long. Then, for example, a wiring pattern is provided along a periphery of the piezoelectric substrate, so that there is a possibility that a large surface area is required.

Therefore, in the second preferred embodiment, a portion of the wiring pattern connecting the additional circuit and the input terminal and the output terminal is provided on the second surface, thus reducing the space required for the wiring pattern added by the additional circuit on the first surface. Therefore, the attenuation characteristics in the blocking band are improved by adding the additional circuit, and it is possible to reduce or prevent the increase in size of the device and to achieve the miniaturization of the device.

Figure 9:
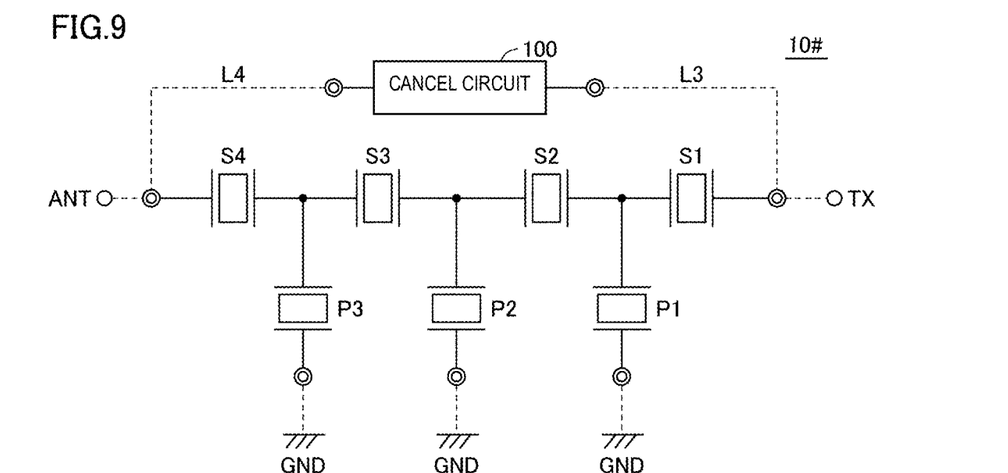
FIG. 9 is a diagram illustrating an example of an equivalent circuit of a surface acoustic wave device according to a second preferred embodiment of the present invention.

FIG. 9 is a diagram illustrating an example of an equivalent circuit of a surface acoustic wave device 10 #according to the second preferred embodiment. In FIG. 9, a configuration in which a cancel circuit 100 is added to the configuration illustrated in FIG. 2 of the first preferred embodiment is provided. In FIG. 9, the description of the elements overlapping similar with those in FIG. 2 will not be repeated.

Referring to FIG. 9, the surface acoustic wave device 10 #further includes the cancel circuit 100 connected in parallel to the filter illustrated in FIG. 2 between the input terminal TX and the output terminal ANT. Although not illustrated in FIG. 9, the cancel circuit 100 preferably includes an amplitude adjustment circuit and a phase adjustment circuit, for example. The phase adjustment circuit inverts a phase of the input signal from the input terminal TX. The amplitude adjustment circuit reduces an amplitude of the input signal from the input terminal TX. The reduced amount in the amplitude is determined in accordance with a magnitude of the blocking band signal in the signal passing through the filter. In this manner, by adding the signal of the opposite phase of the input signal to the output signal from the filter, the attenuation amount of the signal in the blocking band is able to be ensured.

Further, at least one of a portion of the wiring pattern (L3 in FIG. 9) connecting the cancel circuit 100 and the input terminal TX and a portion of the wiring pattern (L4 in FIG. 9) connecting the cancel circuit 100 and the output terminal ANT is provided on the second surface 26 via the through-electrode. By forming the wiring patterns L3 and L4 on the second surface 26 as described above, an increase in the area for the wiring pattern on the first surface 25 caused by the addition of the cancel circuit 100 is able to be reduced or minimized. This makes it possible to ensure the attenuation amount in the blocking band while reducing or preventing an increase in the device size.

Figure 10A:
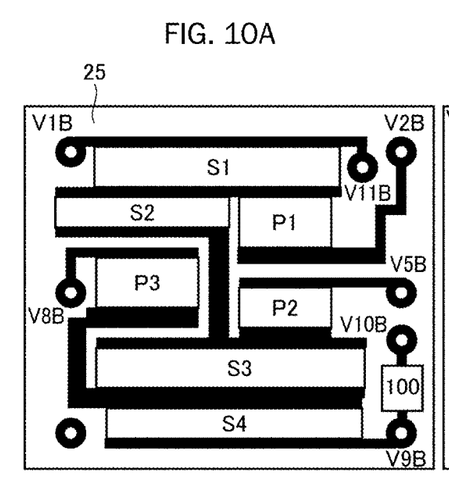
FIGS. 10A and 10B are diagrams illustrating an example of an arrangement of functional elements and wiring patterns on a piezoelectric substrate of the surface acoustic wave device of FIG. 9.
Figure 10B:
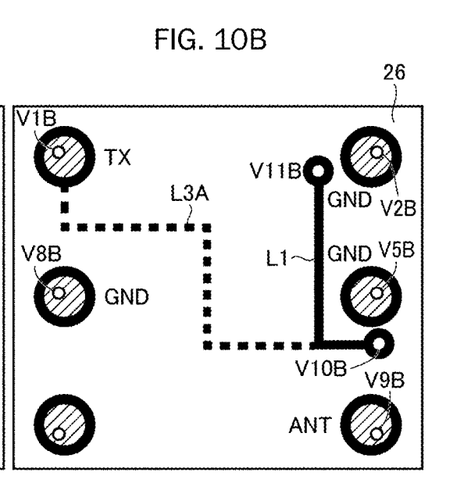

FIGS. 10A and 10B are diagrams illustrating an example of the arrangement of each of the resonance portions and the wiring patterns in the piezoelectric substrate according to the second preferred embodiment. FIGS. 10A and 10B are diagrams of the first surface 25 and the second surface 26 in the piezoelectric substrate 24, respectively, viewed from the positive direction to the negative direction of the Z-axis in the figure in a plan view.

In the example illustrated in FIGS. 10A and 10B, each of the resonance portions on the piezoelectric substrate 24 is preferably arranged in the same or substantially the same manner as the comparative example (FIGS. 4A and 4B) of the first preferred embodiment, and further, the cancel circuit 100 is added to the piezoelectric substrate 24.

One end of the cancel circuit 100 is preferably connected to the terminal ANT of the second surface 26 via a through-electrode V9B, similarly to the series arm resonance portion S4. The other end of the cancel circuit 100 is connected to one end of the wiring pattern L3 of the second surface 26 via a through-electrode V10B. The other end of the wiring pattern L3 is preferably connected to a wiring pattern connected to a through-electrode V1B (i.e., the terminal TX) on the first surface 25 via a through-electrode V11B. Alternatively, as a wiring pattern L3A illustrated in FIG. 10B, the through-electrode V10B and the terminal TX may be directly connected to each other on the second surface 26.

Figure 11A:
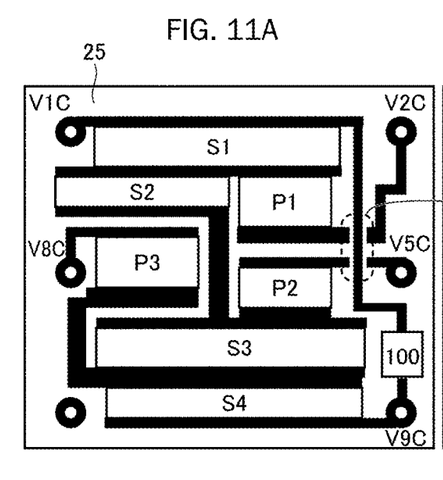
FIGS. 11A and 11B are layout diagrams of a comparative example in which a wiring pattern connecting a cancel circuit and a filter is provided only on the front surface of the piezoelectric substrate of the surface acoustic wave device.
Figure 11B:
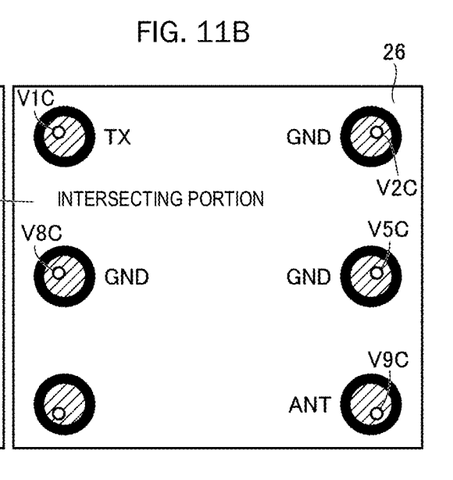

FIGS. 11A and 11B are diagrams illustrating a comparative example in which all of the functional elements and wiring patterns of the circuit similar to those illustrated in FIGS. 10A and 10B are provided on the first surface 25 of the piezoelectric substrate 24. Comparing FIG. 10A and FIG. 11A, it can be seen that the wiring pattern connecting the cancel circuit 100 and the series arm resonance portion S1 intersects with the other wiring patterns in a three dimensional manner. In this manner, when the wiring patterns are intersected, it is necessary to provide the insulating film between the overlapping wiring patterns. Alternatively, in order to eliminate the intersection of such wiring patterns, it is necessary to provide a wiring pattern on an outer side portion of other functional elements or wiring patterns (i.e., along an outer periphery of the piezoelectric substrate 24). Then, the surface area of the piezoelectric substrate 24 needs to be further enlarged, resulting in an increase in the size of the device.

As illustrated in FIGS. 10A and 10B of the second preferred embodiment, by providing a wiring pattern connecting the cancel circuit 100 and the series arm resonance portion S1 to the second surface 26, the intersecting portion of the wiring patterns as illustrated in FIGS. 11A and 11B are able to be eliminated, and the surface area of the piezoelectric substrate 24 is prevented from being enlarged.

Note that although FIGS. 10A and 10B illustrate an example in which only the wiring pattern L3 in FIG. 9 is provided on the second surface 26, the wiring pattern L4 connecting the cancel circuit 100 and the terminal ANT may be provided on the second surface 26 in addition to the wiring pattern L3 depending on the position at which the cancel circuit 100 is arranged. Alternatively, only the wiring pattern L4 may be provided on the second surface 26.

Figure 12:
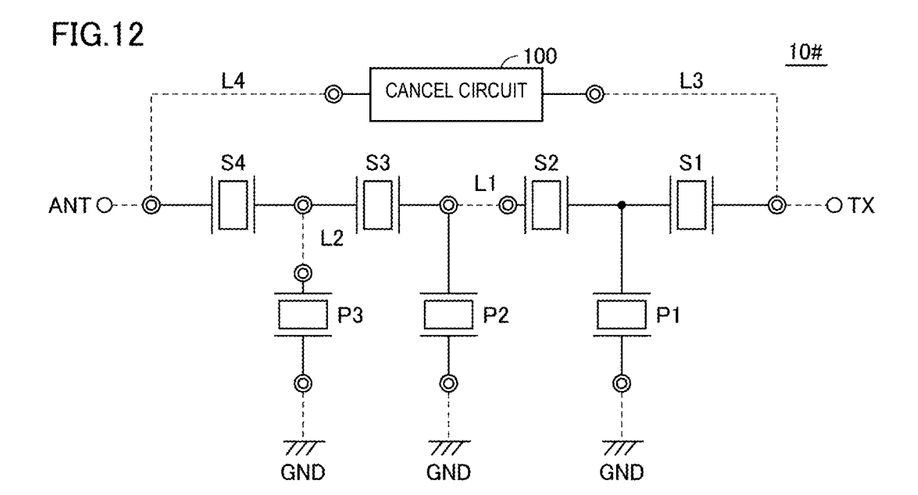
FIG. 12 is a diagram illustrating an example of an equivalent circuit of the surface acoustic wave device in which both of a portion of a wiring pattern between resonance portions in the filter and a portion of a wiring pattern connecting the cancel circuit and the filter are provided on a second surface.

In addition to the wiring patterns (L3 and L4) between the filter and the cancel circuit 100, as illustrated in FIG. 12, a portion of the wiring pattern (L1 and L2) between the resonance portions in the filter may be further provided on the second surface 26 as in the first preferred embodiment. In this case, by appropriately arranging the cancel circuit 100 in the empty space on the first surface 25 obtained by providing the wiring pattern between the resonance portions on the second surface 26, it is possible to further reduce the device size.

Figure 13:
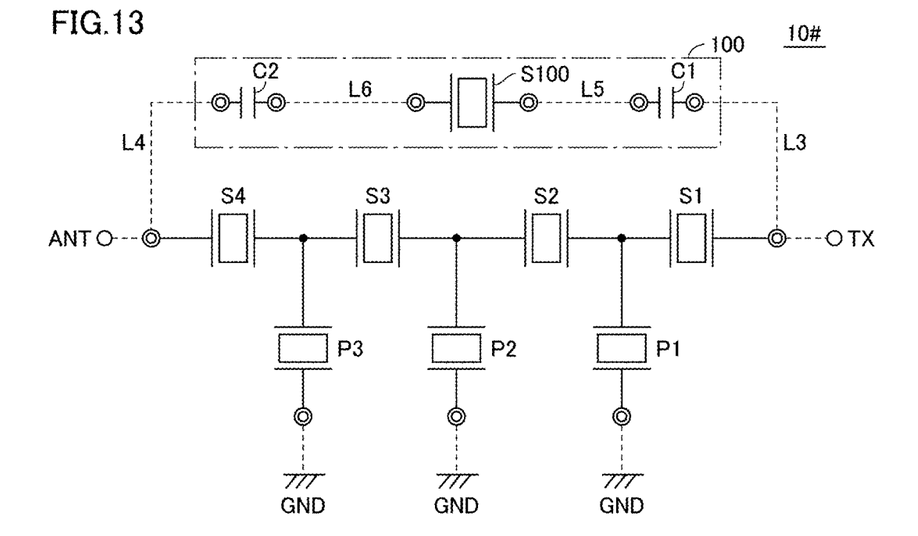
FIG. 13 is a diagram illustrating details of the cancel circuit in FIG. 9.

FIG. 13 is a diagram illustrating details of the cancel circuit 100 in FIG. 9. Referring to FIG. 13, the cancel circuit 100 preferably includes capacitors C1 and C2 defining and functioning as the amplitude adjustment circuit, and a surface acoustic wave vibrator 5100 defining and functioning as the phase adjustment circuit.

One end of the capacitor C1 is connected to the input terminal TX, and the other end thereof is connected to one end of the surface acoustic wave vibrator 5100. The other end of the surface acoustic wave vibrator 5100 is connected to one end of the capacitor C2. The other end of the capacitor C2 is connected to the output terminal ANT.

Here, the capacitors C1, C2 and the surface acoustic wave vibrator 5100 as the functional elements, are arranged on the first surface 25 of the piezoelectric substrate 24, and at least one of a portion of the wiring pattern (L5 in FIG. 13) connecting the capacitor C1 and the surface acoustic wave vibrator 5100 and a portion of the wiring pattern (L6 in FIG. 13) connecting the surface acoustic wave vibrator 5100 and the capacitor C2 is provided on the second surface 26 via the through-electrode. That is, at least a portion of the wiring pattern (at least a portion of the wiring patterns L3 to L6) extending to the output terminal ANT from the input terminal TX through the cancel circuit 100 is provided on the second surface 26 of the piezoelectric substrate 24.

It should be noted that it is not essential to define the amplitude adjustment circuit by two capacitors, and only one of the capacitors C1 and C2 may be provided, if so desired.

In this manner, since a portion of the wiring pattern connecting between the functional elements of the cancel circuit 100 is provided on the second surface 26, the space of the wiring pattern required for the first surface 25 is reduced, thus reducing or preventing an increase in the size of the device.

Note that in the above description, the case where the cancel circuit is provided in the transmission filter has been described as an example, but the cancel circuit may also be applied to the reception filter as illustrated in FIG. 8.

Figure 14:
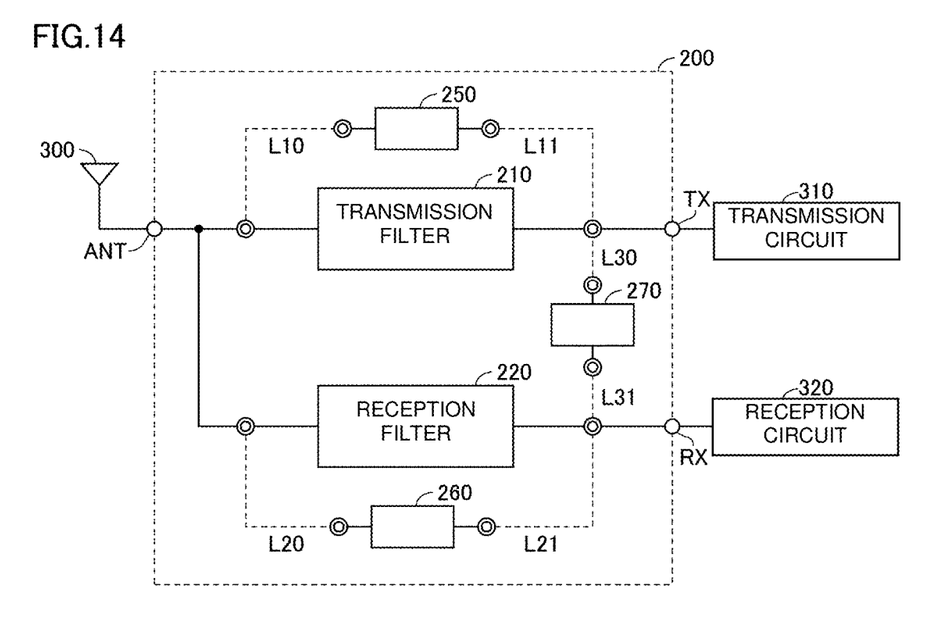
FIG. 14 is a diagram for explaining an arrangement of a cancel circuit in an example of a surface acoustic wave device including both of a transmission filter and a reception filter.

In addition, such a cancel circuit may also be applied to a duplexer in which a transmission filter 210 and a reception filter 220 are provided in one device, as in a surface acoustic wave device 200 illustrated in FIG. 14. In this case, in addition to a cancel circuit 250 connected in parallel to the transmission filter 210 and a cancel circuit 260 connected in parallel to the reception filter 220, it is possible to provide a cancel circuit 270 between the transmission terminal TX for connection to a transmission circuit 310 and the reception terminal RX for connection to a reception circuit 320.

In such a duplexer, since the antenna terminal ANT is shared by the transmission filter 210 and the reception filter 220, when a transmission signal is output from the transmission circuit 310 to the antenna 300, the transmission signal is also able to be transmitted to the reception circuit 320 via the reception filter 220. Further, depending on a distance between a wiring pattern connecting the transmission terminal TX and the transmission filter 210 and a wiring pattern connecting the reception filter 220 and the reception terminal RX, the signal on a transmission side may leak to a reception side due to capacitive coupling between the wiring patterns. Therefore, by providing the cancel circuit 270 between the transmission terminal TX and the reception terminal RX, it is possible to eliminate the influence caused by the transmission signal on the reception signal.

When a cancel circuit is provided in such a duplexer, at least a portion of the wiring patterns (L10, L11, L20, L21, L30 and L31 in FIG. 14) to be connected to each cancel circuit is provided on the second surface 26 of the piezoelectric substrate 24, thus reducing or preventing an increase in the device size while ensuring the attenuation amount in the blocking band in each filter.

Note that although not illustrated in FIG. 14, each of the cancel circuits 250, 260, and 270 illustrated in FIG. 14 may also be provided such that a portion of a wiring pattern connecting between the functional elements included therein is provided on the second surface as illustrated in FIG. 13. Moreover, it is not essential to provide all of the cancel circuits, and a portion of the cancel circuits 250, 260, and 270 may be provided. Further, the first to third variations according to the first preferred embodiment also may be applied to the configuration according to the second preferred embodiment.

As described above, in the surface acoustic wave device, by defining a portion of the wiring pattern connecting between the functional elements on the second surface different from the first surface on which the functional elements are arranged on the piezoelectric substrate, an increase in the device size is able to be reduced or prevented and the degree of freedom in design is able to be improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave device comprising:
a piezoelectric substrate;
a plurality of functional elements on a first surface of the piezoelectric substrate; and
a protective resin member on the piezoelectric substrate; wherein
an interdigital transducer (IDT) electrode is included in at least a portion of the plurality of functional elements, and a surface acoustic wave resonator is defined by the piezoelectric substrate and the IDT electrode;
a portion of a wiring pattern connecting a first functional element and a second functional element included in the plurality of functional elements is provided on a second surface different from the first surface of the piezoelectric substrate; and
at least one of the plurality of functional elements is connected to a terminal electrode provided at a side of the second surface of the piezoelectric substrate.

2. The surface acoustic wave device according to claim 1, wherein the second surface is a back surface when the first surface is set to be a front surface of the piezoelectric substrate.

3. The surface acoustic wave device according to claim 1, wherein
the piezoelectric substrate is a multilayer substrate in which two or more substrate layers are laminated;
the piezoelectric substrate includes a first substrate layer and a second substrate layer laminated on the first substrate layer; and
the second surface is a surface between the first substrate layer and the second substrate layer.

4. The surface acoustic wave device according to claim 3, wherein the second substrate layer includes a back surface with a portion of another wiring pattern being provided on the back surface.

5. The surface acoustic wave device according to claim 3, wherein the piezoelectric substrate is housed in a box-shaped protective housing defined by a supporting substrate, a side wall portion, and a cover portion.

6. The surface acoustic wave device according to claim 1, wherein
a first through-electrode and a second through-electrode penetrating from the first surface to the second surface are provided in the piezoelectric substrate; and
the wiring pattern on the second surface is connected to the first functional element by the first through-electrode, and is connected to the second functional element by the second through-electrode.

7. The surface acoustic wave device according to claim 1, wherein the wiring pattern on the second surface is connected to the first functional element via a first wiring on a first side surface of the piezoelectric substrate, and is connected to the second functional element via a second wiring on a second side surface of the piezoelectric substrate.

8. The surface acoustic wave device according to claim 1, wherein when the piezoelectric substrate is viewed from a lamination direction in a plan view, at least a portion of a wiring pattern on the first surface intersects with the wiring pattern on the second surface.

9. The surface acoustic wave device according to claim 1, wherein a portion of the plurality of functional elements overlaps with the wiring pattern on the second surface when the piezoelectric substrate is viewed from a lamination direction in a plan view.

10. The surface acoustic wave device according to claim 1 further comprising:
an input terminal and an output terminal; wherein
the plurality of functional elements includes:
a filter that passes a signal in a predetermined frequency band among input signals from the input terminal to the output terminal; and
a cancel circuit connected in parallel to the filter between the input terminal and the output terminal;
the cancel circuit attenuates a signal out of the predetermined frequency band among signals output from the output terminal; and
at least a portion of the wiring pattern on the second surface extends to the output terminal from the input terminal through the cancel circuit.

11. The surface acoustic wave device according to claim 10, wherein
the first functional element is the filter, the second functional element is the cancel circuit; and
at least a portion of the wiring pattern on the second surface connects the filter and the cancel circuit.

12. The surface acoustic wave device according to claim 11, wherein
the filter is a reception filter;
the input terminal is connected to an antenna, and the output terminal is connected to a reception circuit; and
the cancel circuit is connected in parallel to the reception filter.

13. The surface acoustic wave device according to claim 11, wherein
the filter is a transmission filter;
the input terminal is connected to a transmission circuit, and the output terminal is connected to an antenna; and
the cancel circuit is connected in parallel to the transmission filter.

14. The surface acoustic wave device according to claim 10, wherein
the cancel circuit includes:
an amplitude adjustment circuit that adjusts an amplitude of the input signal; and
a phase adjustment circuit that adjusts a phase of the input signal;
the first functional element is the amplitude adjustment circuit, and the second functional element is the phase adjustment circuit; and
at least a portion of the wiring pattern on the second surface connects the amplitude adjustment circuit and the phase adjustment circuit.

15. The surface acoustic wave device according to claim 10, wherein
the cancel circuit further includes:
a first amplitude adjustment circuit that adjusts an amplitude of the input signal;
a phase adjustment circuit that adjusts a phase of a signal from the first amplitude adjustment circuit; and
a second amplitude adjustment circuit that adjusts an amplitude of a signal from the phase adjustment circuit;
the first functional element is the phase adjustment circuit;
the second functional element is at least one of the first amplitude adjustment circuit and the second amplitude adjustment circuit; and
at least one of a wiring pattern connecting the first amplitude adjustment circuit and the phase adjustment circuit, and a wiring pattern connecting the phase adjustment circuit and the second amplitude adjustment circuit is a portion of the wiring pattern on the second surface.

16. The surface acoustic wave device according to claim 15,
wherein capacitors define the first amplitude adjustment circuit, and a surface acoustic wave vibrator defines the first phase adjustment circuit.

17. The surface acoustic wave device according to claim 1, wherein
the plurality of functional elements includes:
a transmission filter that filters a signal from a transmission circuit received at a first terminal and output the signal to an antenna;
a reception filter that filters a signal received from the antenna and output the filtered signal to a reception circuit from a second terminal; and
a cancel circuit connected between the first terminal and the second terminal;
the cancel circuit reduces an influence of a signal received at the first terminal on a signal output from the second terminal; and
a portion of the wiring pattern on the second surface is connected to the second terminal from the first terminal through the cancel circuit.

18. The surface acoustic wave device according to claim 1,
wherein the piezoelectric substrate is made of a single crystal material of any one of lithium tantalate ($LiTaO_3$), lithium niobate ($LiNbO_3$), alumina ($Al_2O_3$), and sapphire, or a laminated material made of $LiTaO_3$, $LiNbO_3$, or silicon (Si).

19. A ladder filter comprising:
the surface acoustic wave device according to claim 1; wherein
the ladder filter includes:
an input terminal and an output terminal;
series arm resonance portions; and
parallel arm resonance portions;
the series arm resonance portions are connected in series to a series arm provided between the input terminal and the output terminal; and
the parallel arm resonance portions are provided on a parallel arm connected between the series arm and a ground potential.

20. The ladder filter according to claim 19, wherein at least one of the series arm resonance portions defines a longitudinally coupled resonator filter including the surface acoustic wave resonator.

* * * * *